United States Patent [19]

Soderberg et al.

[11] Patent Number: 5,482,748
[45] Date of Patent: Jan. 9, 1996

[54] METHOD FOR DIAMOND COATING BY MICROWAVE PLASMA

[75] Inventors: Staffan Soderberg, Huddinge; Hamid Shahani, Solna; Mats Sjostrand, Kista, all of Sweden

[73] Assignee: Sandvik AB, Sandviken, Sweden

[21] Appl. No.: 251,661

[22] Filed: May 31, 1994

Related U.S. Application Data

[63] Continuation of Ser. No. 929,380, Aug. 14, 1992, abandoned.

[30] Foreign Application Priority Data

Aug. 16, 1991 [SE] Sweden ................................ 9102378

[51] Int. Cl.$^6$ ........................................... H05H 1/46
[52] U.S. Cl. ................... 427/577; 427/575; 427/249; 427/122; 427/255.5; 423/446; 118/728; 118/729
[58] Field of Search .......................... 427/577, 575, 427/249, 122, 255.5; 423/446; 117/929; 118/728, 729; 51/307; 407/119

[56] References Cited

U.S. PATENT DOCUMENTS

| | | |
|---|---|---|
| 4,707,384 | 11/1987 | Schachner et al. . |
| 4,869,924 | 9/1989 | Ito . |
| 4,943,345 | 7/1990 | Asmussen et al. ................ 427/577 |
| 5,023,065 | 6/1991 | Jones ................................. 427/577 |
| 5,023,068 | 6/1991 | Jones ................................. 427/577 |
| 5,169,676 | 12/1992 | Moran et al. ..................... 427/577 |
| 5,175,019 | 12/1992 | Purdes et al. . |
| 5,271,971 | 12/1993 | Herb et al. ........................ 427/573 |

FOREIGN PATENT DOCUMENTS 327051  8/1989  European Pat. Off. .

OTHER PUBLICATIONS

Bunshah, R. F. Deposition Technologies for Films and Coatings Noyes Publications 1982 p. 20.

*Primary Examiner*—Roy V. King
*Attorney, Agent, or Firm*—Burns, Doane, Swecker & Mathis

[57] ABSTRACT

A method for coating components such as cutting tools with diamond using a microwave plasma excited gas mixture in a reactor equipped with a bowl-shaped substrate table having a concave inner surface for supporting the components to be coated. The plasma forms a plasma ball during the coating operation and the geometrical shape, configuration and position of the table is adapted to stabilize the plasma and control the shape and position of the plasma in such a way that the outer surface of the plasma conforms substantially to the surfaces of the components to be coated.

18 Claims, 3 Drawing Sheets

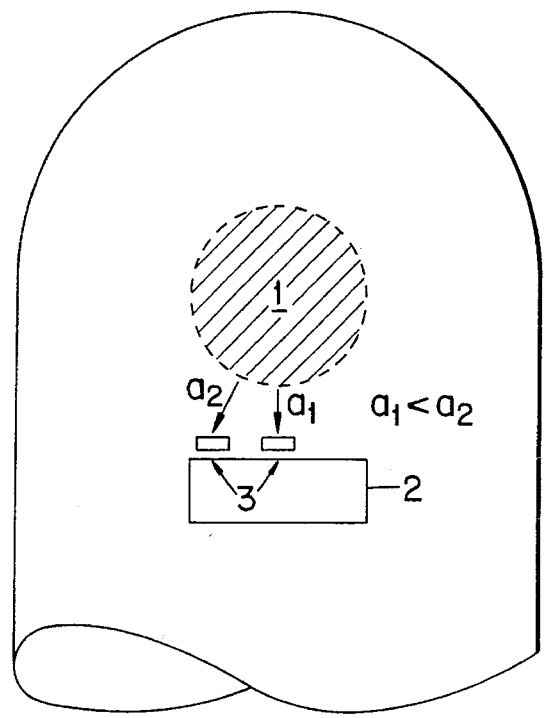
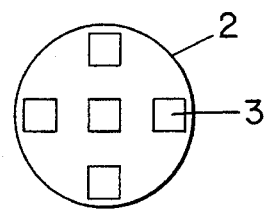
FIG. 1A
PRIOR ART
FIG. 1B
PRIOR ART
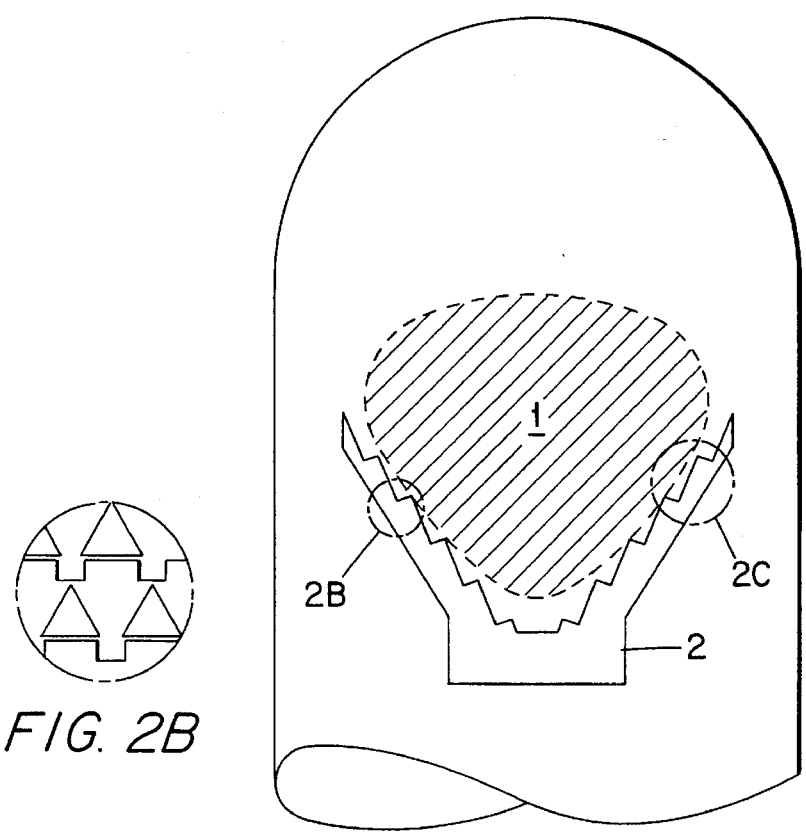
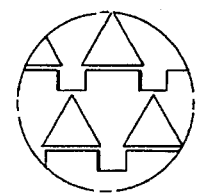
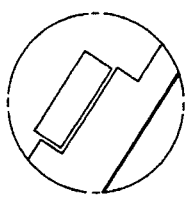
FIG. 2B
FIG. 2A
FIG. 2C

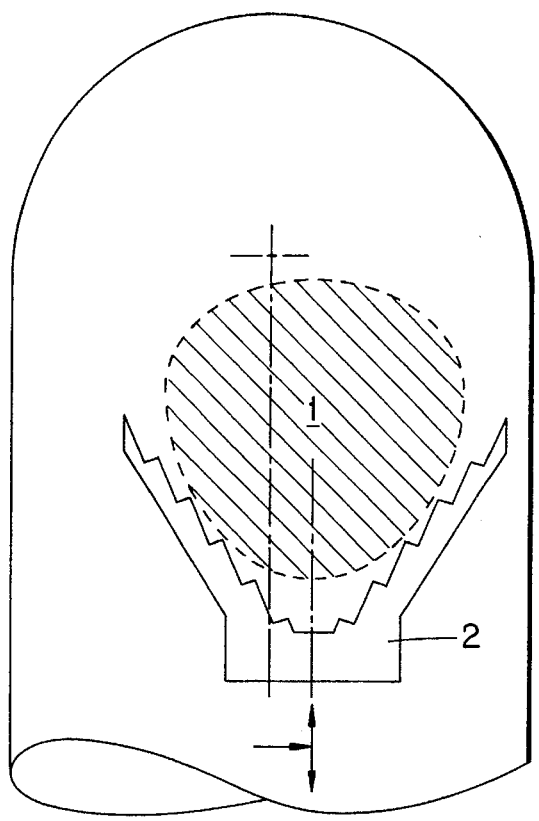
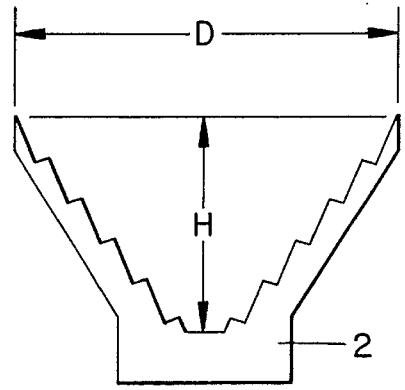
FIG. 3
FIG. 4
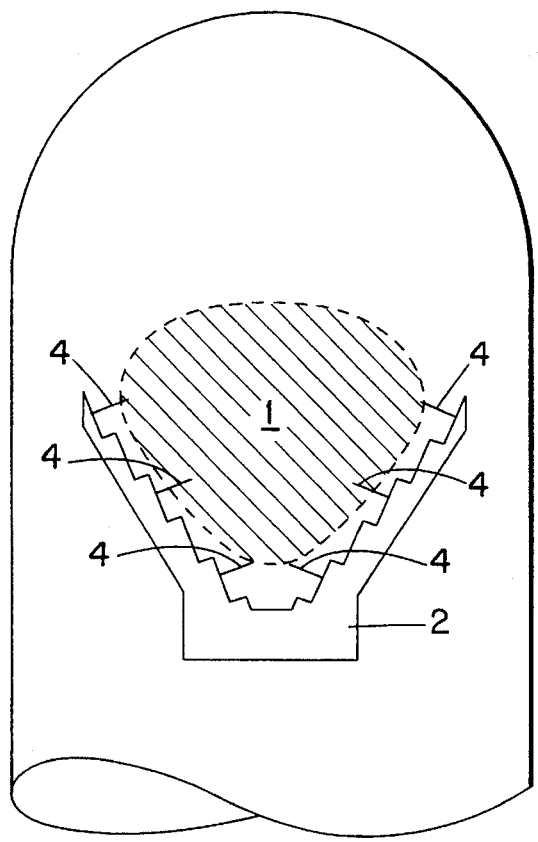
FIG. 5

METHOD FOR DIAMOND COATING BY MICROWAVE PLASMA

This application is a continuation of application Ser. No. 07/929,380, filed Aug. 14, 1992 now abandoned.

BACKGROUND OF THE INVENTION

The present invention relates to a method for diamond deposition directly from a gas mixture excited by a microwave plasma, said method being characterized in that a larger number of individual components can be coated under identical conditions in one single reactor run as compared to what is possible using prior art technology.

Production of diamond directly from the gas phase by CVD or PVD technique is of great interest for coating of cutting tools, drill bits, knives, etc. Gas phase deposition of diamond without formation of graphite was reported in 1977 by Derjaguin and colleagues in Moscow. When the results were reproduced by a group of Japanese scientists in the early eighties, intensive research in CVD diamond started all over the world. A series of new methods for diamond coating from gas phase has been described, including hot filament, microwave plasma, arc discharge plasma, gas flame, hollow cathode, and different forms of plasma jets. Usually pure hydrogen with the addition of 0.1 to 5.0% $CH_4$ is used as gas mixture, but also other hydrocarbon gases can be used as carbon source. In addition, the purity and quality of the diamond film can be controlled by adding other gases, especially gases containing oxygen and/or nitrogen. Different noble gases can also be added to control the process, especially in plasma-based techniques. A relatively early patent is U.S. Pat. No. 4,707,384 that contains references to the earliest work in this area.

Low pressure deposition of diamond coatings has a large potential application in the coating of metal cutting tools like inserts, drills, end-mills, etc. However, this method has not yet been applied on a large industrial scale. One important reason for this lack of application is that the total area that can be coated under identical conditions is relatively small, frequently only a few cm in diameter using prior art technology. This is due to the fact that coating with diamond film needs excitation of the gas phase to temperatures around 2000° C. At the same time, the optimum substrate temperature for diamond deposition is 1000° C. or less. This leads to a strong gradient in temperature and chemical composition in the gas.

In the case of diamond deposition from a microwave plasma, the excited gas volume has a spherical or near-spherical shape. Toroid-shaped plasmas and other more complicated geometries can also be generated but they have not found any practical application since these types of plasmas tend to be unstable and therefore difficult to control during longer deposition times. Standard practice for diamond deposition is to place the components to be coated on a flat substrate table which may be equipped with auxiliary facilities for heating and/or cooling of the table. Since a microwave reactor can be considered as a resonance cavity for microwaves, it is customary to use a flat substrate table in diamond coating according to prior art to obtain a standard resonator geometry. However, the combination of a spherical plasma and a flat substrate table results in a radial variation in deposition conditions due to the variation in distance between the plasma and the table, see FIG. 1. This is valid also when the table is equipped with extra facilities for heating although in this case it may be possible to obtain a uniform temperature over a 100 mm diameter table. An additional problem with a flat table reactor design is that there is difficulty in maintaining a symmetric and stable plasma at high microwave powers.

OBJECTS AND SUMMARY OF THE INVENTION

It is an object of this invention to avoid or alleviate the problems of the prior art.

It is further an object of this invention to provide an improved method and means for carrying out a microwave plasma method for depositing diamond having improved process control.

In one aspect of the invention there is provided a method for diamond coating of at least one component by a microwave plasma excited gas mixture, said coating being performed in a reactor equipped with a bowl-shaped substrate table with a concave inner surface for placing of the components to be coated on the inner surface of the table, the geometrical shape and configuration of the table adapted to stabilize the plasma and control the shape and position of the plasma in such a way that the outer surface of the plasma conforms substantially to the surfaces of components to be coated.

In another aspect of the invention there is provided a bowl-shaped substrate table for use in microwave plasma excited gas mixture coating processes, said table having a concave inner surface including means for placing components to be coated on the inner surface of said table, the geometrical shape and configuration of said table adapted to stabilize the plasma and control the shape and position of the plasma so that the outer surface of the plasma conforms substantially to the surfaces of the components to be coated.

BRIEF DESCRIPTION OF THE DRAWINGS

FIG. 1a is a side view and FIG. 1B is a top view showing a typical configuration for diamond coating of discrete components, typically inserts, according to prior art using microwave plasma with different distances $a_1$ and $a_2$ between the plasma and two inserts.

FIG. 2A shows a schematic drawing according to the present invention with details showing an example of a design for charging individual components like cutting tool inserts.

FIGS. 2B and 2C show details from FIG. 2A of the bowl-shaped substrate table and tool inserts supported on ledges provided on the interior of the table.

FIG. 3 shows a schematic drawing of an example of the invention in which the substrate table is equipped with a device for horizontal and vertical positioning relative to the inner surface of the microwave cavity.

FIG. 4 shows the substrate table according to the invention, in which the substrate table height H and substrate table diameter D are defined.

FIG. 5 shows a further development of the invention in which the substrate table is equipped with a number of metal wires (antennas) to increase the intensity of the plasma near the substrate surfaces.

Figure 6:
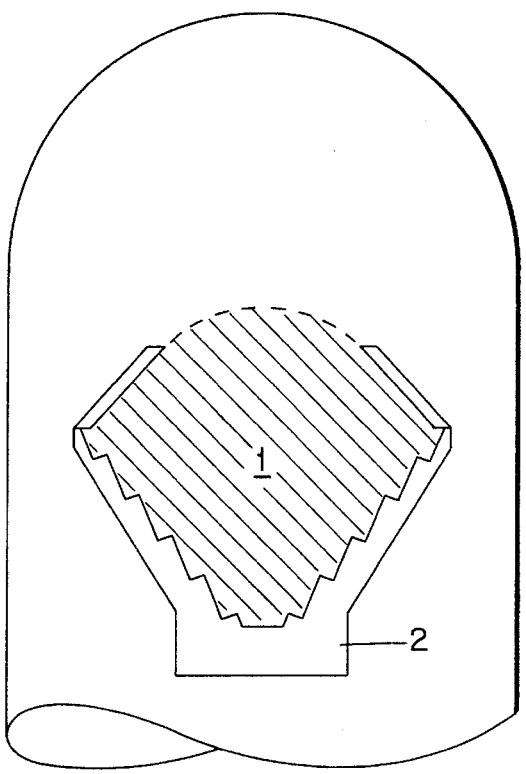
FIG. 6 demonstrates one design according to the invention in which the substrate table is designed so that the plasma couples directly to the table.

In each of the Figures, "1" designates the plasma, "2" the substrate table and "3" the individual components to be coated.

DETAILED DESCRIPTION OF THE PREFERRED EMBODIMENTS OF THE INVENTION

Surprisingly, it has now been discovered that it is possible to form a stable microwave plasma with substrate tables having a geometrical shape other than the flat tables currently used. In particular, it is shown according to the invention that a relatively constant distance and intensity between the outer surface of plasma and the inner surface of the table can be obtained with a bowl-shaped table in which the components are placed on the inner surface of the bowl, with the plasma being generated inside the bowl and using a suitable combination of table geometry and process parameters. This means that the total number of substrates which can be coated in one process under identical conditions (growth rate, crystalline structure) is increased drastically according to the present invention. Surprisingly, it is also found that this new design of the substrate table leads to an improved stability of the plasma and that the shape and position of the plasma can easily be controlled with great accuracy by adjusting the position of the table horizontally and vertically relative to the microwave cavity and also by adjusting the shape and the inclination of the table walls which also gives a further improvement in the uniformity of the coating over the substrate table. Furthermore, the improved stability and control of the plasma using the present invention makes it possible to apply higher microwave powers (>1.5 kW) compared to that possible using earlier technology without causing problems with plasma instabilities. Higher microwave powers result in a more intense plasma and, thus, increase the deposition rate. In addition, the diameter of the plasma ball increases with applied microwave power making it possible to use a larger table and to further increase the total number of components which can be coated in one and the same run. Further improvement in the control of the plasma and enhanced deposition rates is obtained according to the invention by placing auxiliary antennas and/or shaping the upper rim of the bowl so that direct coupling between the plasma and the substrate table occurs. With the reactor design according to the invention, there is also the possibility to optimize the gas flow pattern by making channels in the substrate table. These channels can be used as gas inlets for all or parts of the incoming gas mixture which also results in preheating the incoming gases or for exhausting the gas from the reactor.

According to the invention there is now provided a microwave plasma CVD reactor for diamond deposition of a large number of individual components like cutting tool inserts, in which the components are placed preferably uniformly over the inner surface of a bowl-shaped substrate table. The inner surface can be spherical, conical or have a more complex concave surface. FIG. 2 shows an example of the invention as above in a relatively simple configuration. The bowl-shaped substrate table can be made in one solid piece or be made up by several separate segments. For adjusting optimum coating conditions, the substrate table can be equipped with facilities for x and y translation in the horizontal plane and z translation for vertical height adjustment as well as facilities for table rotation according to FIG. 3. In those cases in which the substrate table is made of individual segments, the reactor may be equipped with facilities for translation of the individual segments in the horizontal plane and height positioning. The individual segments can be constructed so that it is possible to adjust the angle of the individual segments relative to the horizontal plane. The total number of segments can be between 2 and 16, usually between 2 and 8.

The exact shape of the inner surface of the table will vary depending on the number, size and geometry of the components to be coated, the reactor design and the process conditions used. The ratio between the inner surface height H, and diameter D, of the substrate table as defined in FIG. 4, can be used as a simple parameter for the characterization of the table. According to the invention, the H/D ratio should be between 0.1 and 2.0, preferably between 0.2 and 0.5. In order to place the components on the table, the inner surface is designed and manufactured with edges, compartments, rods, holes, etc., depending on the shape of the component and also on which parts of the components are the most critical for their function. As an example, in coating of metal cutting tools according to the invention, the surface of the table should be shaped so that the minimum distance between the cutting edge of the cutting tools to be coated and the table surface on which it rests is at least 1 mm and normally a minimum of 5 mm. One way to reach this goal is using a ledge design as demonstrated in FIG. 2.

According to the invention, the bowl-shaped substrate table may be equipped with a number of metallic wires or rods (antennas 4), FIG. 5, preferably made of W, Ta, Re, graphite or other high temperature material like ceramic materials such as aluminum oxide, silicon carbide, etc., for additional control of the plasma shape. The antennas are mounted on the table so that parts of them protrude from the table surface. The antennas can be curved with one or both ends fastened on the substrate table. They can also extend across the substrate table. The length of the antennas is normally between 2 and 20 mm but even lengths from 1 mm up to 500 mm can be used. Surprisingly, it has turned out that these wires or rods affect the microwave field in the reactor and can be used as elements for further control of the shape and position of the plasma by careful design of the pattern in which they are positioned. A particular design to achieve such control can be determined by experimentation by the skilled artisan. Antennas as control elements can therefore be used for further improvements of the uniformity of the plasma but it is also found that such control elements can drastically enhance the growth rate and improve coating quality. FIG. 5 shows a schematic drawing of a substrate table equipped with antennas according to the invention.

In a further embodiment of the bowl-shaped substrate table according to the invention, the upper rim of the table is extended and shaped differently as compared to the rest of the table. One example of this type of design is shown in FIG. 6. Surprisingly it is found that the microwave plasma can be made to couple directly to the table by carefully designing the upper rim of the table. The plasma spreads itself over the substrate table in direct contact with the components which are to be coated. With this configuration, very high growth rates can be reached. The film obtains a uniform crystalline structure and thickness.

It is also shown that a bowl-shaped substrate table according to the invention can be used to obtain a more uniform gas flow pattern through the reactor. In one embodiment, the substrate table is equipped with a number of channels 5 through which reactant gases can be introduced or exhausted. Usually between 2 and 10 channels are drilled at suitable positions around the table but it is also possible to have more channels, for example, one at each component to be coated. With this configuration it is surprisingly found that an improvement regarding uniformity and quality of the coating is obtained and also that a remarkable increase in deposition rate can be achieved.

Figure 7:
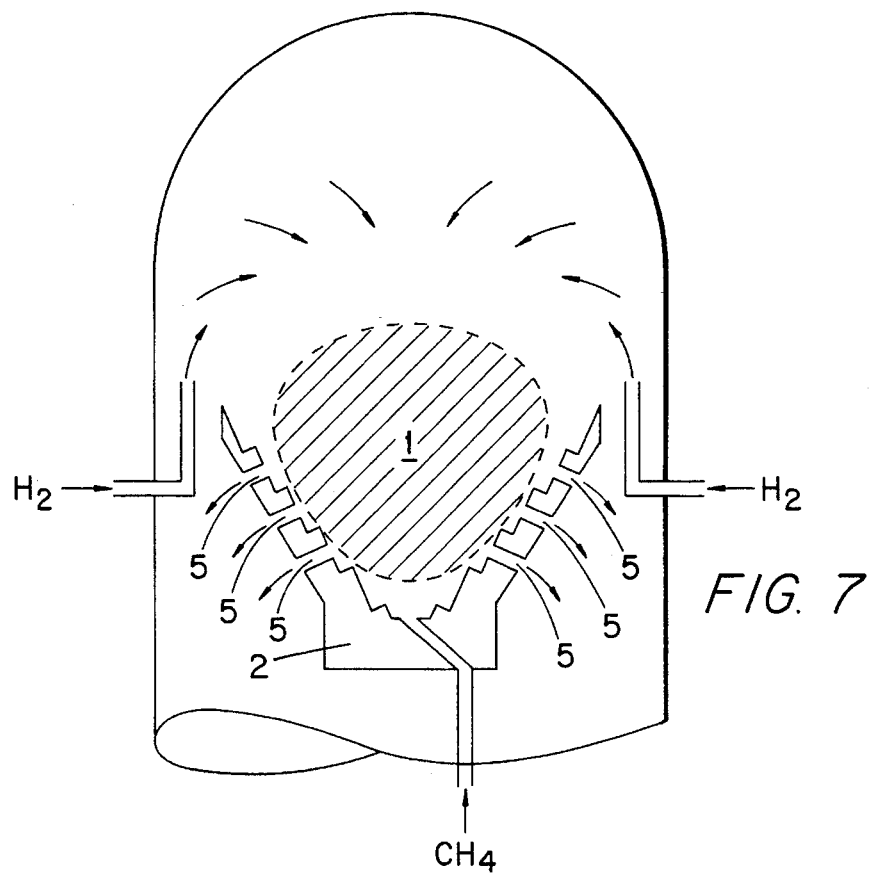
FIG. 7 shows a design according to the invention in which the substrate table is equipped with channels for optimizing the gas flow.

In another embodiment of the invention, the reactor is equipped with separate gas inlets for hydrocarbon and hydrogen gas (or for different mixtures of these two gases) in which the hydrocarbon is released through the channels and hydrogen from above the substrate table. The reactive gases are pumped out around the sides of the substrate table or through additional channels in the substrate table. With this configuration, not only coating rate and quality and uniformity is improved, but also the graphite content of the film is reduced to a minimum. FIG. 7 shows a schematic drawing of this embodiment of the invention.

The bowl-shaped substrate table can be manufactured of graphite, boron nitride, quartz or other suitable high temperature material. The surfaces for placing of the components to be coated can be manufactured in an easy-to-machine material such as graphite and subsequently coated with a material that is more suitable from a chemical point of view, such as quartz, boron nitride, silicon carbide or aluminum oxide. The substrate table can also be equipped with facilities for separate heating, for example induction heating or resistive heating. Alternatively, the reactor can be equipped with a separate system for heating, for example, conventional furnace heating or separate heating of the inlet gases. The substrate table itself can also be used to heat up the incoming gases by allowing the gas mixture or part of it to enter the reactor through channels in the heated substrate table. When coating at high microwave powers (>3 kW), it may instead be necessary to cool the substrate table using cooling channels in order to avoid overheating of the substrates.

In yet another embodiment of the invention, the gas pressure in the reactor is cyclically varied during deposition. It has been found that cyclic variation of the pressure results in a further improvement of the coating uniformity within a batch. The frequency of the pressure fluctuation is typically between 2 cycles/min and 2 cycles/hour with a ratio between the maximum and minimum pressure usually between 1.2 and 2. Alternatively, a similar enhancement of batch uniformity can be obtained by a similar cyclic variation of the microwave power. In either case it may be required that the reactor is equipped with the necessary control functions to maintain a minimum reflected microwave power in spite of the variation in process conditions.

The reactor can be constructed according to the known technology for microwave plasma CVD, for example with a cylindrical stainless steel cavity with a quartz bell jar in which the microwave plasma is generated. The reactor can be of the "variable-mode" type but most common is a "fixed-mode" microwave applicator. The reactor is normally equipped with a gas control system, vacuum pumps and pressure regulators according to conventional CVD technology.

The inlet and outlet gases can be arranged according to the known technique for microwave plasma reactors where gases usually arrive from above to pass through the plasma and stream down by the substrate table. For many applications it is advantageous that the substrate table is equipped with channels so that the gases are pumped out through the substrate table. In this embodiment, according to the invention, it is even possible to change the gas flow path which allows incoming gases to flow through the substrate table and be pumped out at the top or out over the sides of the substrate table. Especially according to the invention, the microwave reactor can be equipped with two separate gas inlets for the hydrogen and the hydrocarbon gases, in which one gas enters through channels in the substrate table and the other gas arrives from the top or along the sides of the table. It is obvious for those experienced in diamond coating that this method can be used to divide the incoming gas in other proportions and also be applied to other gas mixtures for diamond deposition according to prior art. By optimizing the gas flow according to the method described in the invention, very good coating quality can be obtained over a large number of inserts.

For process monitoring and control, the substrate table can be equipped with a number of thermocouples (not shown) mounted in different positions on the substrate table. Alternatively, the temperature on selected points on the table can be measured with a pyrometer through one or several inspecting windows during the process. The measured temperatures can be used for adjusting the position of the substrate table as well as the angle and the position of each individual segments in those cases in which the table is made of individual segments for obtaining uniform deposition parameters.

With the reactor according to the invention, different discrete components can be coated with diamond. In particular, the reactor design according to the invention is suitable for diamond coating of components made of high speed steel, cemented carbide, cermets, ceramics, cubic boron nitride, diamond and other typical tool materials. In addition, the reactor according to the invention is especially well suited for coating of tools such as inserts, end mills, twist drills, drill bits, knives, scalpels, tool-adhesive-bonding (TAB) tools, etc.

The common frequency for generating microwave plasma is 2.45 GHz and all the examples below are given for a reactor tuned to this frequency. However, it is obvious for those skilled in the art that the frequency determines the size of the plasma. For example, it is possible to obtain a spherical plasma with approximately three times larger diameter as compared to 2.45 GHz by using 915 MHz. Thus, it is possible with a reactor constructed according to the invention to directly increase the number of components that can be coated in a single run with approximately a factor of 10 by reducing the microwave frequency to 915 MHz.

The invention is additionally illustrated in connection with the following Examples which are to be considered as illustrative of the present invention. It should be understood, however, that the invention is not limited to the specific details of the Examples.

EXAMPLE 1

In one embodiment of the invention, a conventional "fixed-mode" microwave plasma reactor made of stainless steel was used, equipped with a quartz bell-jar, a 1.5 kW microwave power supply and 3.5 kW power supply (10–100 kHz) for induction heating of the substrate table. A bowl-shaped substrate table made of graphite with an outer diameter of 120 mm and with the inner surface of the table inclined at 45 degrees relative to the horizontal plane, in the following designated table design A, was used. The inner surface of the table was equipped with ledges at four different levels suitable for loading quadratic inserts, for example SPUN 120304 geometry. Inserts were also placed on the bottom horizontal surface with a diameter of 40 mm. In total, 59 inserts can be loaded into the reactor using this table with the following number of inserts on each level:

| | |
|---|---|
| Level 1 | 4 inserts |
| Level 2 | 8 inserts |
| Level 3 | 12 inserts |
| Level 4 | 16 inserts |
| Level 5 | 19 inserts | in which level 1 is the lowest and level 5 is the top level. With the conventional technique, a flat substrate table with 100 mm diameter can hold 24 inserts on three different radial distances from the center of the table.

Diamond deposition was performed with 1% $CH_4$ in $H_2$ with a total gas flow of 1/min and 1500 W microwave power. Silicon nitride inserts were used as substrates. The temperature was adjusted so that an average temperature of 900° C. on the inserts was reached. After 20 hours deposition, the following film thickness values were obtained at the different positions on the substrate table:

| Known technique | | | According to the invention | |
|---|---|---|---|---|
| Radial distance | 7 mm | 12 μm | level 1: | 8 μm |
| (from the center | 22 mm | 8 μm | level 2: | 11 μm |
| of the substrate | 40 mm | 4 μm | level 3: | 10 μm |
| to the inner edge | | | level 4: | 9 μm |
| of the insert) | | | level 5: | 3 μm |

With the demand on a maximum 25% variation in the film thickness, only 12 inserts were produced with the known technique while with the substrate table according to the invention, the number of coated inserts having a maximum 25% variation in film thickness increases to 38 inserts. In machining tests (face milling Al-18% Si alloy, wet, cutting speed "V" 1500 m/min, feed/tooth "S" 0.15 mm/rev and depth-of-cut a 1.0 mm) of inserts from different levels the following tool lives were obtained:

| Known technique Radial distance (mm) | minutes | level | According to the invention min. |
|---|---|---|---|
| 7 | 10.2 | 1 | 7.1 |
| 22 | 3.3 | 2 | 12.6 |
| 40 | 0.3 | 3 | 11.3 |
| | | 4 | 9.8 |
| | | 5 | 0.2 |

With a demand on a tool life time of minimum 5 minutes and a maximum variation of 25% in tool life, only four accepted inserts were produced with the known technique whereas with the reactor design according to the invention a total of 34 accepted inserts were produced.

EXAMPLE 2

With the same microwave reactor as in Example 1 and also with the same substrate tables according to the known technique and according to the invention, the microwave power was increased to 3500 W by using a 5 kW microwave power supply. The average substrate temperature was maintained at 900° C. by adjusting the substrate table heating. In this case the following thickness values were obtained:

| Known technique Radial distance | Film Thickness | Level Film Thickness | Accoding to the invention |
|---|---|---|---|
| 7 mm | 5 μm | 1: | 12 μm |
| 22 mm | 17 μm | 2: | 16 μm |
| 40 mm | 7 μm | 3: | 18 μm |
| | | 4: | 16 μm |
| | | 5: | 15 μm |

With a demand of a maximum variation in film thickness of 25%, this means that the known technique gives eight coated inserts while with the reactor design according to the invention 54 coated inserts were produced. Using the known technique also resulted in a large variation in film thickness between inserts placed at the same distance from the center. As an example, film thickness for inserts placed at a radial distance of 22 mm, typically varies from 11 to 22 μm measured on the edges facing toward the plasma and between 8 and 17 μm for those edges facing outward. When the inserts were placed according to the invention, the total variation in film thickness for all inserts on levels 2 to 5 was 5 μm with no measurable differences between the different edges on the same insert. In machining tests of inserts from different positions the following average tool lives were obtained:

| Known technique Radial distance | | Level | According to the invention |
|---|---|---|---|
| 7 mm | 1.3 min | 1: | 12.1 min |
| 22 mm | 14.4 min | 2: | 18.1 min |
| 40 mm | 3.1 min | 3 | 20.4 min |
| | | 4: | 19.2 min |
| | | 5: | 16.9 min |

EXAMPLE 3

In a further coating experiment, using the same process parameters as in Example 2, the microwave power was increased to 4600 W. With a reactor according to the known technique, it was not possible to form a stable plasma since the plasma tends to jump to one side of the quartz bell-jar wall. This results in melting the quartz bell-jar in less than a minute. With the reactor according to the invention, the plasma was still stable as in the earlier examples and the higher power resulted in a further increase in the deposition rate. Under the same deposition period as in Example 2, the following film thickness values were achieved:

| | |
|---|---|
| Level 1 | 17 μm |
| Level 2 | 21 μm |
| Level 3 | 23 μm |
| Level 4 | 22 μm |
| Level 5 | 22 μm |

With a substrate table with the same geometry as the one described above but with an outer diameter of 145 mm, the volume was increased to 86 inserts by placing 28 inserts on level 6. This table was in the following designated embodiment B of the invention. In an experiment with parameters as above but with the enlarged graphite table, embodiment B, the following film thickness values were obtained:

| | |
|---|---|
| Level 1 | 15 μm |
| Level 2 | 17 μm |
| Level 3 | 18 μm |
| Level 4 | 18 μm |
| Level 5 | 18 μm |
| Level 6 | 16 μm |

EXAMPLE 4

Another graphite table with the same basic geometry as embodiment B in Example 3 but equipped with 172 holes, 6 mm in diameter, was manufactured. The holes were positioned at the points where the edge corners on two adjacent inserts were located during deposition. During deposition a fraction of the incoming gases was pumped out through these holes. This table was designated embodiment C of the invention. In one deposition experiment performed with this table and parameters as in Example 3, the following thickness values were achieved:

| | |
|---|---|
| Level 1 | 20 μm |
| Level 2 | 22 μm |
| Level 3 | 22 μm |
| Level 4 | 21 μm |
| Level 5 | 21 μm |
| Level 6 | 20 μm |

Comparing the results with Example 3 above shows that an increase in the deposition rate and further reduction in film thickness variation was obtained.

EXAMPLE 5

A graphite table with the same geometrical design as embodiment C was manufactured. This table was coated with 15±5 μm thick SiC film by conventional CVD process at 1100° C. according to the known technique. This substrate was called embodiment D of the invention. In a deposition experiment with the same process parameters as in Example 3, the following film thickness values were obtained:

| | |
|---|---|
| Level 1 | 18 μm |
| Level 2 | 19 μm |
| Level 3 | 19 μm |
| Level 4 | 20 μm |
| Level 5 | 19 μm |
| Level 6 | 17 μm |

Substrate table D gives a slight reduction in deposition rate as compared with table C. However, investigation of the resulting coating by SEM indicated an improved purity of the diamond film since severe charging-up occurred due to the irradiation of the electron beam.

EXAMPLE 6

Ceramic $Si_3N_4$ inserts with the geometry SPKN 12 03 EDR were coated with 12±1 μm thick diamond film in seven different deposition experiments. The reactor design and the process parameters for the different experiments are given below. A constant film thickness was obtained by control of the deposition time:

1) Coating which the known technique with 1.5 kW microwave power and a flat substrate table with the inserts placed at 22 mm distance from the center and process parameters as in Example 1.
2) Coating according to the invention with 1.5 kW microwave power and with table embodiment A. Test inserts were placed on levels 1–4 and dummy inserts on level 5. Process parameters as in Example 1.
3) Coating with the known technique with 3.5 kW microwave power and a flat substrate table with inserts placed at 22 mm distance from center and process parameters as in Example 2.
4) Coating according to the invention with 3.5 kW microwave power using table embodiment A. Test inserts were placed on the levels 2–5 and dummy inserts on level 1. Process parameters as in Example 2.
5) Coating according to the invention with 4.6 kW microwave power and with table embodiment B with test inserts on levels 1–6 (no dummy inserts), process parameters were as in Example 3.
6) Coating according to the invention with 4.6 kW microwave power and with table embodiment C. Test inserts were placed on levels 1–6 (no dummy inserts). Process parameters were as in Example 4.
7) Coating according to the invention with 4.6 kW microwave power and with table embodiment D. Test inserts were placed on level 1–6 (no dummy inserts). Process parameters as in Example 5.

Ten inserts were randomly chosen from each deposition experiment. For coating with known technique, as in experiments 1 and 3, two runs were required to produce enough test inserts. Testing was performed in a milling operation of a water pump casing made of Al-8%Si-3.5%Cu. The machining conditions were as follows:

v=2000 m/min s=0.05 mm/rev a=3 mm

The coating was considered worn-out when extensive burr formation on the machined surface occurs. The total number of water pump casings which were produced for the different deposition runs was as follows:

| | Number of casings |
|---|---|
| 1) 1.5 kW according to the known technique | 3590 |
| 2) 1.5 kW according to the invention, embodiment A | 14122 |
| 3) 3.5 kW according to the known technique | 6212 |
| 4) 3.5 kW according to the invention, embodiment A | 29459 |
| 5) 4.6 kW according to the invention, embodiment B | 41791 |
| 6) 4.6 kW according to the invention, embodiment C | 43811 |
| 7) 4.6 kW according to the invention, embodiment D | 58922 |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method for diamond coating by microwave plasma, the method comprising a step of coating surfaces of components with diamond by forming a microwave plasma excited gas mixture into a plasma ball and contacting the components with the plasma ball, said coating step being performed in a reactor equipped with a bowl-shaped substrate table with a concave inner surface, the concave inner surface including ledges supporting the components to be coated and the components being arranged such that the outer surface of the plasma ball conforms to the surfaces to be coated.

2. The method of claim 1 wherein the geometrical shape, configuration and position of the table is adapted to stabilize the plasma and control the shape and position of the plasma in such a way that the outer surface of the plasma conforms substantially to the surfaces of the components to be coated.

3. The method of claim 1 wherein the ratio of height H and diameter D of the bowl-shaped substrate table is between 0.1 and 1.0.

4. The method of claim 3 wherein the ratio of H/D is between 0.2 and 0.5.

5. The method of claim 1 wherein the substrate table is divided into 2 to 16 segments and each segment is capable of being translated individually in the horizontal plane and/or inclined individually relative to the horizontal plane and central axis and/or rotated in the horizontal plane.

6. The method of claim 5 wherein said substrate table is divided into 2 to 8 segments.

7. The method of claim 1 wherein the concave inner surface of the bowl-shaped substrate table has an essentially conical or spherical shape.

8. The method of claim 1 wherein the bowl-shaped table is equipped with a system of channels for optimized gas flow over said components.

9. The method of claim 1 wherein the reactor is equipped with one or more separate gas inlets, at least one of the inlets entering the reactor through the substrate table and at least one reactive gas which forms the plasma entering the reactor through the substrate table.

10. The method of claim 1 wherein a system of metallic or ceramic wires or rods is mounted on the bowl-shaped table to further control the shape and position of the plasma as well as yield additional excitation of the gas mixture.

11. The method of claim 1 wherein the upper edge of the bowl-shaped table is shaped so that the plasma couples directly to the table and thereby stays in direct contact with whole table surface and on the components mounted thereon.

12. The method of claim 1 wherein said components are metal cutting tools.

13. The method of claim 12 wherein said metal cutting tools are coated while on said ledges, the cutting edges of said tools being at least 1 mm from the inner surface of the table.

14. The method of claim 1 wherein the gas pressure and/or microwave power is varied cyclically during the deposition.

15. The method of claim 1 wherein the plasma forms a plasma ball during the coating and a relatively constant distance and intensity is maintained between an outer surface of the plasma and the inner surface of the bowl-shaped substrate table by moving the table in vertical and/or horizontal directions during the coating.

16. The method of claim 1, wherein the substrate table includes at least one gas inlet extending through the concave inner surface and at least one reactive gas passes outwardly through the gas inlet during the coating step.

17. The method of claim 1, wherein the plasma conforms to the surfaces to be coated by positioning the substrate table with respect to the plasma ball so that the outer surface of the plasma ball conforms to the surfaces to be coated.

18. The method of claim 1, wherein the substrate table includes inlets, the method further comprising passing the gas mixture through the inlets in the substrate table so that the gas mixture is preheated by the substrate table prior to passing outwardly through the inlets.

* * * * *